(12) United States Patent
Narita et al.

(10) Patent No.: US 7,435,948 B2
(45) Date of Patent: Oct. 14, 2008

(54) ADHERENCE OF A SOLID-STATE IMAGE-SENSING DEVICE TO A SUBSTRATE

(75) Inventors: Hirochika Narita, Kanagawa (JP); Ryuya Kuroda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 71 days.

(21) Appl. No.: 11/436,643

(22) Filed: May 19, 2006

(65) Prior Publication Data

US 2006/0261250 A1 Nov. 23, 2006

(30) Foreign Application Priority Data

May 20, 2005 (JP) ............................. 2005-147610

(51) Int. Cl.
*H01L 27/14* (2006.01)
(52) U.S. Cl. ...................... 250/239; 257/431; 250/214.1
(58) Field of Classification Search ............. 250/208.1, 250/239, 214.1; 257/431
See application file for complete search history.

(56) References Cited

U.S. PATENT DOCUMENTS 5,988,707 A * 11/1999 Abe et al. .................... 257/666
6,226,187 B1 * 5/2001 Questad et al. ............. 361/707
6,404,049 B1 * 6/2002 Shibamoto et al. .......... 257/712
6,483,567 B1 * 11/2002 Okada ........................ 349/158
6,706,961 B2 * 3/2004 Shimizu et al. ............. 136/256
6,800,836 B2 * 10/2004 Hamamoto et al. ...... 250/208.1
2004/0016873 A1 * 1/2004 Kida et al. ............... 250/214 R

FOREIGN PATENT DOCUMENTS

JP 09-260407 10/1997
JP 2005-019680 1/2005

* cited by examiner

*Primary Examiner*—Stephen Yam
(74) *Attorney, Agent, or Firm*—Young & Thompson

(57) ABSTRACT

To provide a solid-state image sensing device that is capable of improving the connection reliability of bonding pads and bonding wires. A solid-state image sensing element 1 of the present invention contains a long plate-shaped metal substrate 16, a long plate-shaped solid-state image sensing element 4 fixed to the surface of the metal substrate 16 via an adhesive layer 18, and bonding pads 6, formed on the surface of the solid-state image sensing element 4, for electrically connecting to the lead frame via bonding wires 14. The adhesive layer 18 contains a first adhesive layer 18a, and a second adhesive layer 18b of a higher modulus of elasticity than the first adhesive layer 18a, and at the regions directly below the bonding pads 6 provided at both end sections in a longitudinal direction of the solid-state image sensing element 4, the metal substrate 16 and the solid-state image sensing element 4 are fixed via the second adhesive layer 18b.

7 Claims, 6 Drawing Sheets

PRIOR ART

PRIOR ART

ADHERENCE OF A SOLID-STATE IMAGE-SENSING DEVICE TO A SUBSTRATE

This application is based on Japanese patent application NO. 2005-147610, the content of which is incorporated hereinto by reference.

BACKGROUND

1. Technical Field

The present invention relates to a solid-state image sensing device having a solid-state image sensing element with a plurality of phototransistors formed in a line.

2. Related Art

That disclosed, for example, in Japanese Laid-open patent publication NO. 2005-19680 may be given as a solid-state image sensing device of the related art. An outline perspective view of a solid-state image sensing device disclosed in the same document is shown in FIG. 5, and a cross-sectional view along line B-B of the solid-state image sensing device shown in FIG. 5 is shown in FIG. 6. In FIG. 5, diagrammatic representation of a glass plate is omitted.

Solid-state image-sensing device 100 contains a long plate-shaped solid-state image sensing element 104 at a substantially central part with a molded case 102. A plurality of bonding pads 106 are provided at the surface at both end sections in the longitudinal direction of solid-state image sensing element 104. The surfaces of inner leads 108 are exposed within the molded case 102. The bonding pads 106 and the inner leads 108 are electrically connected via bonding wires 114. Further, the inner leads 108 pass through the molded case 102 so as to be electrically connected to outer leads 110 at the outer part of the molded case 102. A lead section 112 is formed from the inner leads 108 and outer leads 110. As shown in FIG. 6, solid-state image sensing element 104 is fixed to the surface of a metal substrate 116 via an adhesive layer 118. Adhesive layer 118 is an adhesive layer with a low modulus of elasticity. Technology taking adhesive layer 118 as an adhesive layer with a low modulus of elasticity is disclosed in Japanese Laid-open patent publication NO. H 9-260407. Further, the upper end opening of the molded case 102 is closed by a glass plate 120.

SUMMARY OF THE INVENTION

With this kind of solid-state image sensing device 100, the solid-state image sensing element 104 and the metal substrate 116 are fixed using the adhesive layer 118 with a low modulus of elasticity. In this way, by using the adhesive layer 118 with a low modulus of elasticity, it is possible to reduce warpage in the longitudinal direction of the solid-state image sensing element 104 or warping fluctuation due to the usage environment and the reading function of the solid-state image sensing device 100 can therefore be stabilized.

However, when the adhesive layer 118 of a low modulus of elasticity is used, ultrasonic energy applied during bonding is absorbed by the adhesive layer 118, and the ultrasonic energy applied to the connecting sections is therefore insufficient. Because of this, the connection of the bonding pads 106 and the bonding wires 114 is insufficient and there is the fear that the reliability of the connections will fall.

According to the present invention, there is provided a solid-state image sensing device comprising: a long plate-shaped metal substrate; a long plate-shaped solid-state image sensing element fixed to the surface of the metal substrate via an adhesive layer; and bonding pads formed on the surface of the solid-state image sensing element, for electrically connecting with the lead frame via the bonding wires, wherein the adhesive layer is comprised of a first adhesive layer, and a second adhesive layer of a higher modulus of elasticity than the first adhesive layer, and the metal substrate and the solid-state image sensing element are fixed via the second adhesive layer at a region directly under the bonding pads provided at both end sections in a longitudinal direction of the solid-state image sensing element.

According to present invention, at regions directly below the bonding pads, the metal substrate and the solid-state image sensing element are fixed using a second adhesive layer of a higher modulus of elasticity than the first adhesive layer. As a result, the reliability of the connections of the solid-state image sensing device is improved because the bonding pads and the bonding wires are bonded in a state where the ultrasonic energy applied during bonding is in a state of being applied sufficiently to the connecting sections.

According to the present invention, a solid-state image sensing device is provided that is capable of improving the connection reliability between bonding pads and bonding wires.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognized that many alternative embodiments can be accomplished using the teachings of the present invention and that the invention is not limited to the embodiments illustrated for explanatory purposes.

The following is a description given using the drawings of a preferred embodiment of the present invention. In all of the drawings, the same elements of the configuration are given the same numerals and descriptions thereof are omitted as appropriate.

Figure 1:
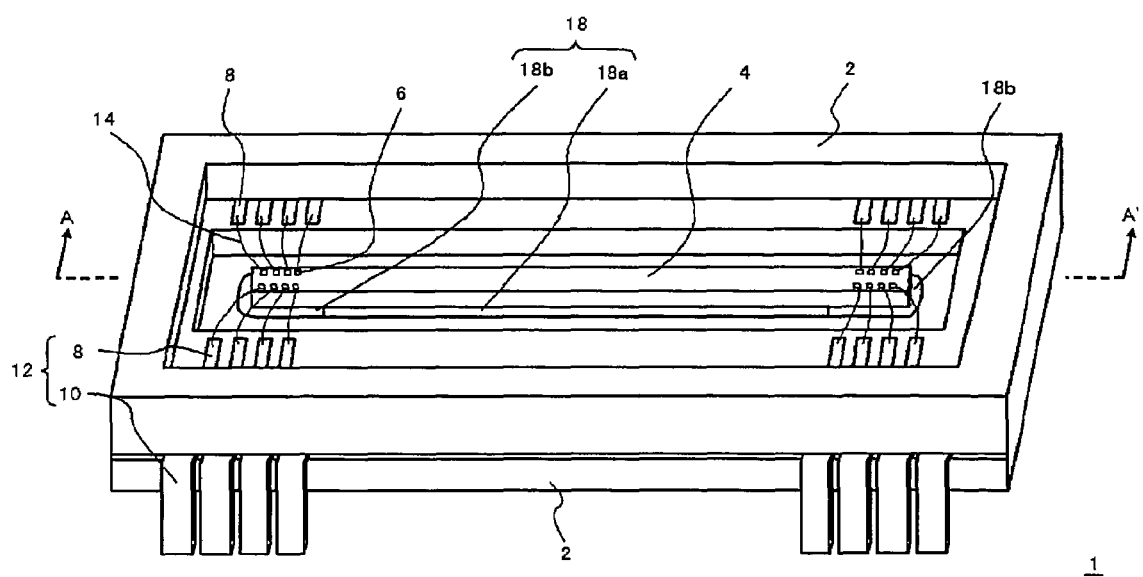
FIG. 1 is an outline perspective view of a solid-state image sensing device of present embodiment.
Figure 2:
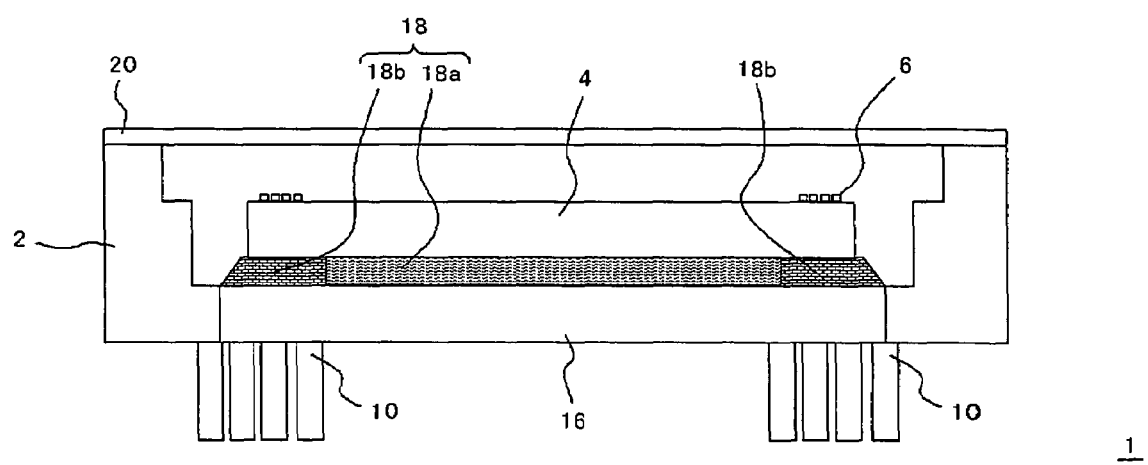
FIG. 2 is a cross-sectional view along line A-A' of the solid-state image sensing device shown in FIG. 1.

An outline perspective view of a solid-state image sensing device of present embodiment is shown in FIG. 1, and a cross-sectional view along line A-A of a solid-state image sensing element 1 shown in FIG. 1 is shown in FIG. 2. In FIG. 1, diagrammatic representation of a glass plate is omitted. Solid-state image-sensing device 1 contains a long plate-shaped solid-state image sensing element 4 at a substantially central part within a molded case 2. A plurality of bonding pads 6 are provided at the surface at both end sections in the longitudinal direction of solid-state image sensing element 4. The surfaces of a plurality of inner leads 8 are exposed within the molded case 2. The bonding pads 6 and the inner leads 8 are electrically connected via respective bonding wires 14. Further, the inner leads 8 pass through the molded case 2 so as to be electrically connected to outer leads 10 at the outer part of the molded case 2. The lead section 12 is formed from the inner leads 8 and the outer leads 10. Further, the upper end opening of the molded case 2 is closed by a glass plate 120.

The solid-state image sensing element 4 employs a one-dimensional CCD element including phototransistors arranged in a line. The solid-state image sensing element 4 is a long plate-shape of, for example, a length of approximately 30 mm to 90 mm, a width of approximately 0.3 mm to 1 mm, and a thickness of approximately 0.4 mm to 0.7 mm. A plurality of bonding pads 6 are provided at both end sections in the longitudinal direction of solid-state image sensing element 4.

As shown in FIG. 2, the solid-state image sensing element 4 is fixed to the surface of a metal substrate 16 via an adhesive layer 18. Diagrammatic representation of the phototransistors formed at the solid-state image sensing element 4 is omitted. The adhesive layer 18 contains a first adhesive layer 18a, and a second adhesive layer 18b of a higher modulus of elasticity than the first adhesive layer 18a. The metal substrate 16 and solid-state image sensing element 4 are in a region directly under the bonding pads 6 provided at either ends in a longitudinal direction of the solid-state image sensing element 4 and are fixed via the second adhesive layer 18b. Further, the metal substrate 16 and the solid-state image sensing element 4 are fixed to other regions via the first adhesive layer 18a. As a result, the bonding pads 6 and the bonding wires 14 are connected in a state where sufficient ultrasonic energy applied during bonding is applied to the connecting section. As a result, the connection reliability of the solid-state image sensing device 1 is improved. The boundary between the first adhesive layer 18a and the second adhesive layer 18b does not have to be clearly defined and these mixed layers may be formed at the boundary.

It is also possible to use a heat sink of an iron or an alloy taking iron as a main component, or a heat sink of copper or an alloy taking copper as a main component as the metal substrate 16. In present embodiment, it is preferable to use a heat sink of an iron or an alloy taking iron as a main component. The surface of the heat sink may be blackened. In this case, it is possible to provide resistance to rusting and corrosion and suppress diffuse reflection.

At the solid-state image sensing device 1, the modulus of elasticity of the second adhesive layer 18b is relatively higher than the modulus of elasticity of the first adhesive layer 18a. Here, modulus of elasticity means the storage elastic modulus (25 degree C. to 100 degree C.) due to dynamic viscoelasticity measurements. Dynamic viscoelasticity measurements are carried out in conformance with JIS K7198 using, for example, solid-state viscoelasticity measuring apparatus YVS-500 (Yoshimizu Corporation).

First adhesive layer 18a is composed of, for example, silicone resin, epoxy resin, polymide resin, or a modified product of these. In present embodiment, the first adhesive layer 18a is preferably composed of a silicone resin with superior insulating properties, and is further preferably composed of an addition polymerization type silicone resin that does not shrink on curing as a result of heating. The first adhesive layer 18a is formed by applying and then hardening a first adhesive. Any adhesive such as a thermally hardening adhesive, light-hardening adhesive, or normal temperature hardening adhesive etc. may be used as the first adhesive. Specifically, a liquid adhesive contained low-elasticity silicone resin (for example, KJR-9038 series, X-35-247N-4, X-35-247N-10B (Shin-Etsu Chemical Co., Ltd.), or a liquid adhesive contained low-elasticity epoxy resin (for example, NR-200 (Sanyu Rec Co. Ltd); XM-2437/HV690 (Nippon Pelnox Corporation) etc. may be given as the first adhesive. Further, film adhesive can also be used as the first adhesive. In addition to a resin component, the first adhesive may also contain a filler of alumina, zinc oxide, silver, or silica etc., a catalyst, or an organic solvent, etc. As a result of containing a filler, thermal conduction is improved, and the heat dissipation of the solid-state image sensing element 4 can be carried out more effectively. Further, one of either a one component type adhesive or a two component adhesive is may be adopted but a one component type can also preferably be used form the point of view of operativity.

The second adhesive layer 18b may be composed of, for example, a silicone resin, epoxy resin, or a modified product thereof, etc. In present embodiment, this is preferably composed of a silicone resin with superior insulating properties, and is further preferably composed of an addition polymerization type silicone resin that does not shrink on curing as a result of heating. The second adhesive layer 18b can be formed by applying and hardening the second adhesive. Any adhesive such as a thermally hardening adhesive, light-hardening adhesive, or normal temperature hardening adhesive etc. may be used as the second adhesive. Specifically, a liquid adhesive contained high-elasticity silicone resin (for example, KJR-600 series (Shin-Etsu Chemical Co., Ltd.), or a liquid adhesive contained high-elasticity epoxy resin (for example, ABLEBOND 84-3MV (Nippon Ablestick Corporation) etc. may be given as the second adhesive. Further, a film may also be used as the second adhesive. In addition to a resin component, this kind of second adhesive may also contain a filler of aluminum, zinc oxide, silver, or silica etc., a catalyst, or an organic solvent, etc. As a result of containing a filler, thermal conduction is improved, and it is possible to carry out heat dissipation of the solid-state image sensing element 4 more effectively. Further, one of either a one component type adhesive or a two component adhesive is may be adopted but a one component type can also preferably be used form the point of view of operativity.

It is also possible for the first adhesive layer 18a and the second adhesive layer 18b to be used in such a manner as to be combined so as to combine silicone resin with silicone resin, or combine epoxy resin with epoxy resin.

The following is a description of the effects of the solid-state image sensing device 1 of present embodiment.

At the regions directly below the bonding pads 6 provided at both end sections in a longitudinal direction of the solid-state image sensing element 4, the metal substrate 16 and the solid-state image sensing element 4 are fixed by the first adhesive layer 18a via the second adhesive layer 18b of high modulus of elasticity.

As a result, the connection reliability of the solid-state image sensing device 1 is improved because the ultrasonic energy applied during bonding is sufficiently applied to the connecting sections of the bonding pads 6 and the bonding wires 14.

Further, the storage elastic modulus of the second adhesive layer 18b is greater than or equal to 4 GPa and less than or equal to 15 GPa, and preferably more than or equal to 6 BPa and less than or equal to 10 GPa. By having the storage elastic modulus of the second adhesive layer 18b in this range, ultrasonic energy applied during bonding is not absorbed by the second adhesive layer 18b, and is sufficiently applied to the connecting section. As a result, the reliability of connections of the bonding pads and the bonding wires is improved. On the other hand, the storage elastic modulus of the first adhesive layer 18a is greater than or equal to 0.001 GPa and less than or equal to 0.1 GPa. Warping of the solid-state image sensing element 4 can then be mitigated by having the storage elastic modulus of the first adhesive layer 18a in this kind of range.

As shown in FIG. 1 and FIG. 2, the region directly below the bonding pads 6 provided at both end sections in a longitudinal direction of the solid-state image sensing element 4, the metal substrate 16 and the solid-state image sensing element 4 are fixed via the second adhesive layer 18b having a storage elastic modulus of the aforementioned range. Further, at a region excluding the region directly under the bonding pads 6, the metal substrate 16 and the solid-state image sensing element 4 are fixed by the first adhesive layer 18a having a storage elastic modulus of the aforementioned range. By giving the solid-state image sensing device 1 this kind of configuration, the bonding reliability of the solid-state image sensing element 4 is improved, warping of the solid-state image sensing element 4 during actual use is alleviated, and a function for reading manuscripts etc. is stabilized.

Further, with the solid-state image sensing device 1 of present embodiment, the bonding wires 14 can be formed from aluminum or an alloy etc. taking aluminum as a main component. The bonding pads 6 can be formed from aluminum or an alloy taking aluminum as a main component, etc. In this respect, the solid-state image sensing device 100 of the related art could not adopt this kind of configuration. The reason for this is described below.

Figure 6:
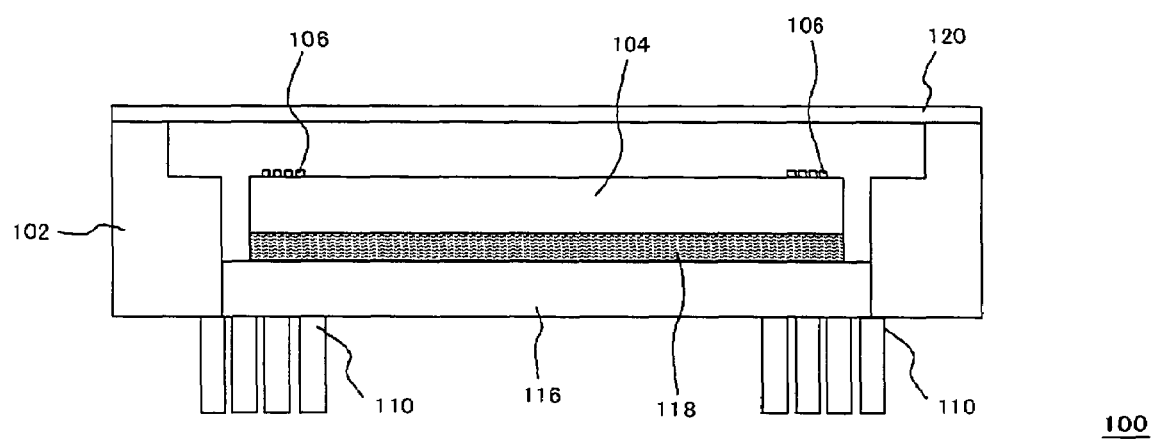
FIG. 6 is a cross-sectional view along line B-B' of the solid-state image sensing device shown in FIG. 5.

With the solid-state image sensing device 100 of the related art shown in FIG. 6, bonding pads containing an alloy taking aluminum as a main component are used as the bonding pads 106, and gold wire is used as the bonding wire 114. In this way, the bonding wire 114 and the bonding pads 106 can be relatively easily connected through heating by applying ultrasonic energy.

However, in recent years, the speed of CCD's has advanced and the amount of heat generated by the solid-state image sensing element 104 has also increased. This temperature causes an aluminum-gold alloy to be formed at the connecting section of the bonding pads 106 containing alloy taking aluminum as a main component and gold wires (bonding wires 114), with an alloy reaction advancing due to heating of the solid-state image sensing element 104 so as to form an intermetallic compound. The strength of this intermetallic compound is low and its resistance to corrosion is also low. As a result, in recent years, the drop in the reliability of connections of solid-state image sensing devices has become marked due to disconnection of bonding wires and bonding pads etc. Because of this, it has been necessary to form the bonding wire from an alloy etc. taking aluminum as a main component so as to be the same as the bonding pads, so as to prevent generation of an aluminum-gold alloy and improve connection reliability. This means that connection of the bonding wires and the bonding pads formed from alloys each taking aluminum as a main component is carried out only by application of ultrasonic energy.

However, with this kind of solid-state image sensing device 100 of the related art, the solid-state image sensing element 104 and the metal substrate 116 are fixed via the adhesive layer 118 with a low modulus of elasticity. As a result, ultrasonic energy applied during bonding is absorbed by the adhesive layer 118, and the ultrasonic energy applied to the connecting sections is therefore insufficient. Because of this, the connection of the bonding pads 106 and the bonding wire 114, both of which are formed from alloys taking aluminum as a main component, is not sufficient, and the reliability of the connection for solid-state image sensing device 100 falls.

With regards to this, in present embodiment, at the region directly under the bonding pads 6, the metal substrate 16 and the solid-state image sensing element 4 are interposed by the second adhesive layer 18b of a relatively high modulus of elasticity, and the second adhesive layer 18b is adhered to the upper surface of the metal substrate 16 and the lower surface of the solid-state image sensing element 4. As a result, ultrasonic energy applied during bonding is sufficiently applied to the connecting section. Because of this, even if the bonding pads 6 and the bonding wires 14 are formed using an alloy taking aluminum as a main component, sufficient connecting strength is obtained therebetween, and the reliability of the connection of the solid-state image sensing device 1 is improved.

The solid-state image sensing device 1 is capable of being made in the following manner. The method for manufacturing the solid-state image sensing device 1 is described with reference to the processes of FIG. 3A to FIG. 4E.

Figure 3A:
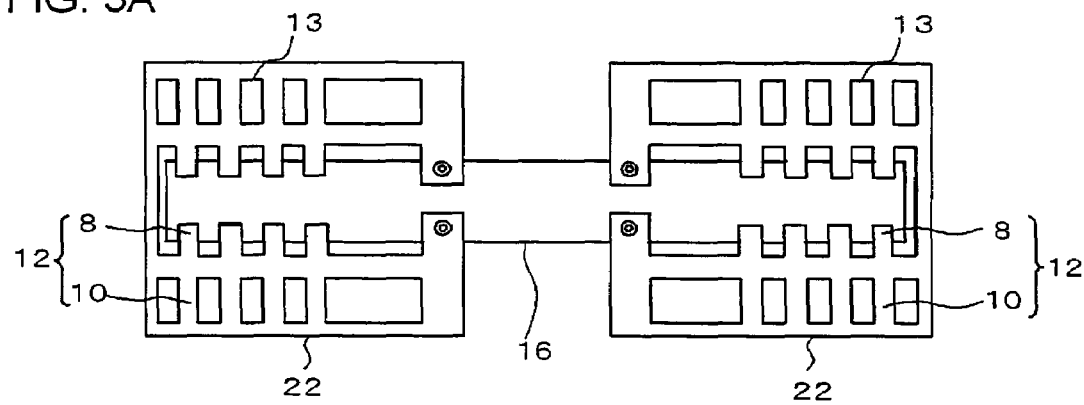
FIG. 3A to 3C is a top view of steps showing steps for manufacturing the solid-state image sensing device of present embodiment.

First, each of the lead frames 22 are fixed to the surfaces of both end sections of the metal substrate 16 in a longitudinal direction (FIG. 3A). The lead frames 22 include lead sections 12 containing inner leads 8 and outer leads 10, and an outer frame 13.

Figure 3B:
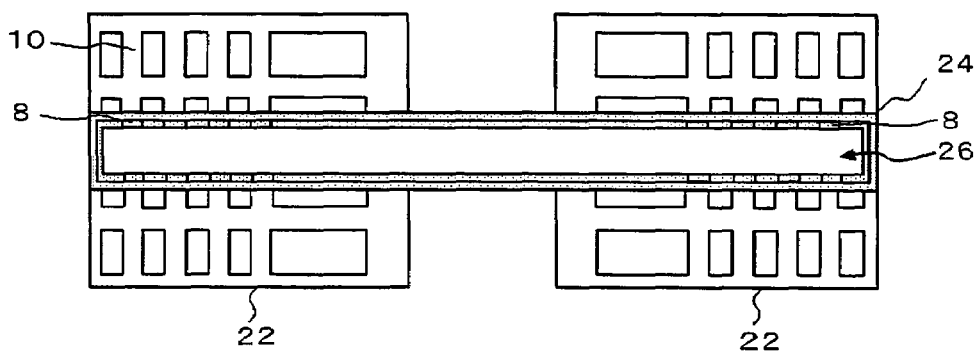

A molded case 24 is then formed on the metal substrate 16 fixed the lead frames 22 (FIG. 3B). The molded case 24 is a box shape open at an upper end and has a recess section 26. The side walls of the recess section 26 are formed in two steps, and the surface of the metal substrate 16 is exposed at the bottom surface. The surface of the inner leads 8 are exposed at the surface of the lower step of the sidewall of the recess section 26. The molded case 24 is manufacturing by housing the metal substrate 16 with the lead frames 22 to within a predetermined metal mold and molding with a thermosetting insulating resin, etc.

Figure 3C:
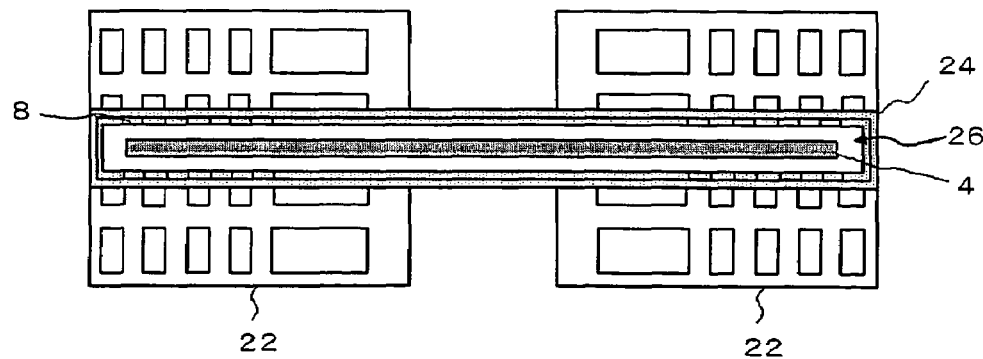

Next, a solid-state image sensing element 4 is fixed to substantially the central part of the surface of the metal substrate 16 exposed at the bottom surface of the recess section 26 (FIG. 3C). Specifically, the solid-state image sensing element 4 is fixed to the surface of the metal substrate 16 exposed within the recess section 26 via the first adhesive layer 18a and the second adhesive layer 18b. In order to form the adhesive layer 18, an adhesive (first adhesive) forming the first adhesive layer 18a and an adhesive (second adhesive) forming the second adhesive layer 18b are applied at predetermined positions using a dispenser. The applied first adhesive and second adhesive are spaced by a predetermined distance.

Figure 4D:
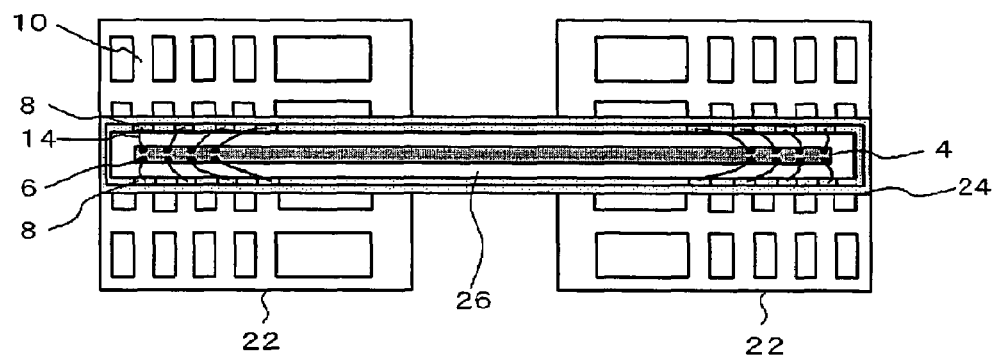
FIG. 4D to 4E is a top view of steps showing steps for manufacturing the solid-state image sensing device of present embodiment.
Figure 4E:
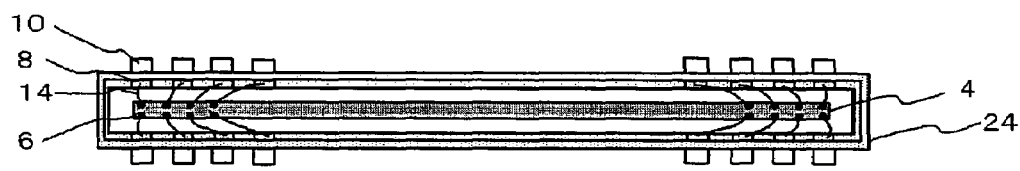
Figure 5:
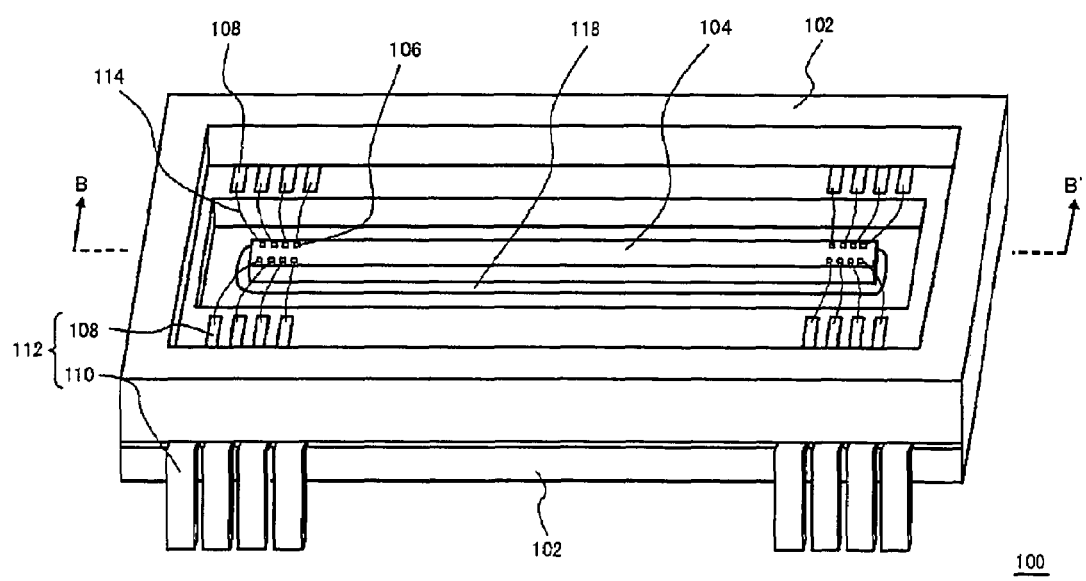
FIG. 5 is an outline perspective view of a solid-state image sensing device of the related art.

Next, the inner leads 8 exposed within the recess section 26 and the bonding pads 6 formed at the surface of the solid-state image sensing element 4 are connected by each of the bonding wires 14 (FIG. 4D). In present embodiment, it is possible to form both the bonding pads 6 and the bonding wires 14 from an alloy taking aluminum as a main component. These are then connected using the application of ultrasonic waves. In present embodiment, at the regions directly below the bonding pads 6 provided at both end sections in a longitudinal direction of the solid-state image sensing element 4, if fixing is achieved using the second adhesive layer 18b of a relatively high modulus of elasticity, a sufficiently strong connection between the bonding pads 6 and the bonding wires 14 can be obtained.

However, as in the related art, when the solid-state image sensing element 4 and the metal substrate 16 are fixed only using a low modulus of elasticity adhesive layer, connection of the bonding pads 6 and the bonding wires 14 is not carried out sufficiently. As a result of thorough investigations, the inventors acquired the knowledge that the cause of this is that ultrasonic energy is absorbed by the low elasticity adhesive layer so that sufficient ultrasonic energy required for connecting the solid-state image sensing element 4 and the metal substrate 16 is not supplied. Based on this knowledge, the inventors have found that the aforementioned problem can be resolved by fixing the metal substrate 16 and the solid-state image sensing element 4 using the second adhesive layer 18b of a modulus of elasticity higher than the first adhesive layer 18a at the regions directly under the plurality of bonding pads 6 provided at both end section in the longitudinal direction of the solid-state image sensing element 4. As a result, the reliability of the connections of the solid-state image sensing device 1 is improved because the bonding pads 6 and the bonding wires 14 are bonded in a state where the ultrasonic energy applied during bonding is in a state of being applied sufficiently to the connecting sections.

As described above, after connecting the inner leads 8 and the bonding pads 6 using bonding wires 14, a glass plate 20 is affixed to the upper end section of the molded case 24 with the upper end opened, and the opening at the upper end of the molded case 24 is closed. Moreover, the solid-state image sensing device 1 of present embodiment can be made by eliminating unnecessary portions of the lead frames 22 and bending of the outer leads 10. The elimination of the unnecessary portions of the lead frames 22 and the processing for bending of the outer leads 10 may be carried out in advance before fixing the solid-state image sensing element 4 to the metal substrate 16.

The solid-state image sensing device 1 of present embodiment manufactured in this way is, for example, a long shape 100 mm long, 15 mm wide, and 10 mm thick. The solid-state image sensing device 1 is capable of being used in electronic equipment having an image reading function such as a copier or scanner etc. taken as a line sensor.

In the above, a description is given of the embodiments of the present invention with reference to the drawings but this merely illustrates examples of the present invention, and various other configurations can also be adopted.

In present embodiment, a description is given of a configuration where the first adhesive layer 18a and the second adhesive layer 18b are single layer films but these may also be multi-layer films in a range that is not detrimental to the effects of the present invention. For example, the case where an adhesive layer for treatment of surface is formed on the lower surface of the solid-state image sensing element 4 or the upper surface of the metal substrate 16 may be given.

Further, fixing of the solid-state image sensing element 4 and the metal substrate 16 via another adhesive layer at a region excluding the regions directly below the end sections in a longitudinal direction of the solid-state image sensing element 4 in a range that is not detrimental to the effects of the present invention.

Further, bonding pads 6 are provided only at the surface of both end sections in a longitudinal direction of the solid-state image sensing element 4 but a bonding pads 6 may also be formed at sections other than both end sections.

Moreover, the combination of the first adhesive layer 18a and the second adhesive layer 18b of present embodiment can similarly be used for CMOS sensors etc.

It is apparent that the present invention is not limited to the above embodiment, that may be modified and changed without departing from the scope and spirit of the invention.

EXAMPLES

The following is a specific description of the embodiments of the present invention but the present invention should by no means be considered limited to these embodiments.

Example 1

The solid-state image sensing device 1 shown in FIG. 1 and FIG. 2 is made, and the degree of bonding and warping of the solid-state image sensing device 1 are confirmed based on the following methods. The material used during preparation of the solid-state image sensing device 1 is as shown in the following.

bonding pad 6: pure aluminum bonding wire 14: aluminum containing 1% silicon.

first adhesive layer 18a: storage elastic modulus (25 degree C.) 0.01 GPa, a liquid adhesive contained low modulus of elasticity addition polymerization-type silicone resin (sample name: X-35-247N-4 (Shin-Etsu Chemical Co., Ltd.), composition: low elasticity silicone resin approximately 15% by weight, filler approximately 85% by weight, and catalyst (Pt) 1% by weight or less) are used. Measurement of the storage elastic modulus (25 degree C.) using dynamic viscoelasticity measurements conforms with JIS K7198 using solid-state viscoelasticity measuring apparatus YVS-500 (Yoshimizu Corporation).

second adhesive layer 18b: storage elastic modulus (25 degree C.) 9.7 GPa, a liquid adhesive contained high modulus of elasticity addition polymerization-type silicone resin (sample name: KJR630 series (Shin-Etsu Chemical Co., Ltd.), composition: high elasticity silicone resin approximately 100% by weight, platinum (catalyst) 1 weight % or less), are used for forming. Dynamic viscoelasticity measurements are carried out in the same way as described above.

(Bonding)

The bonding wires 14 are pressed against the bonding pads 6 of the surface of the solid-state image sensing element 4, and after the application of ultrasonic waves, the connection states are confirmed, and are evaluated under the standards described in the following. Results shown in table 1.

O: The state of connection of the bonding pads 6 and the bonding wires 14 is good.

x: A large number of locations where the bonding pads 6 and the bonding wires 14 are not connected are observed.

(Warping of Solid-State Image Sensing Element 4)

Change in warping of the solid-state image sensing element 4 occurring at a surface temperature of 25 degree C. of the solid-state image sensing device 1 and change in the warping of solid-state image sensing element 4 in the event of change in the surface temperature from 25 degree C. to 60 degree C. is measured using a temperature variable laser three-dimensional displacement measurement apparatus LS150-RTH60 (manufactured by T-Tech) for the solid-state image sensing device 1, and evaluation is performed using the following standards. Results shown in table 1. The solid-state image sensing device 1 contains the metal substrate 16 warping in a longitudinal direction by around 100 μm, the molded case 2, and the solid-state image sensing element 4 is used.

O: warping and change in warping of the solid-state image sensing element 4 in the order of 0 to 20 μm.

x: warping and change in warping of the solid-state image sensing element 4 in the order of 50 to 100 μm.

Comparative Example 1

Other then the solid-state image sensing element 4 and the metal substrate 16 being adhered using the liquid adhesive contained low modulus of elasticity addition polymerization-type silicone resin, manufacture of the solid-state image sensing device 1 is the same as for the first embodiment. In accordance with the aforementioned method, bonding and warping of the solid-state image sensing element is confirmed. Results shown in table 1.

Comparative Example 2

Other then the solid-state image sensing element 4 and the metal substrate 16 being formed using the liquid adhesive contained high modulus of elasticity addition polymerization-type silicone resin, manufacture of the solid-state image sensing device is the same as for the first embodiment. In accordance with the aforementioned method, bonding and warping of the solid-state image sensing element is confirmed. Results shown in table 1.

TABLE 1

|  | FIRST EMBODIMENT | FIRST COMPARATIVE EXAMPLE | SECOND COMPARATIVE EXAMPLE |
|---|---|---|---|
| BONDING | ○ | X | ○ |
| WARPING OF SOLID-STATE IMAGE-SENSING ELEMENT | ○ | ○ | X |

With the solid-state image sensing device 1 of the Example 1, the metal substrate 16 and the solid-state image sensing element 4 are fixed by the second adhesive layer 18b at a region directly under the bonding pads 6. As is clear from table 1, the connected state (bonding) of the bonding pads 6 and the bonding wires 14 of the solid-state image sensing device 1 of the Example 1 are good, and connection reliability of the solid-state image sensing device 1 is improved. Further, at a region excluding the region directly under the bonding pads 6, the metal substrate 16 and the solid-state image sensing element 4 are fixed by the first adhesive layer 18a, and warping of the solid-state image sensing device 1 is therefore alleviated. It is therefore clear that by using the second adhesive layer 18b with a storage elastic modulus (25° C. to 100° C.) in a range from 4 GPa to 15 GPa and the first adhesive layer 18a of a storage elastic modulus of a range of 0.001 GPa to 0.1 Gpa, the reliability of the connections of the solid-state image sensing device 1 is improved and warping of the solid-state image sensing device 1 is alleviated.

In this respect, in comparative example 1, the solid-state image sensing element 4 and the metal substrate 16 are fixed to each other via an adhesive layer of a low modulus of elasticity. Because of this, it is clear that a large number of locations where the bonding pads 6 and the bonding wires 14 do not make contact are observed, and connection reliability falls. Further, in comparative example 2, the solid-state image sensing element 4 and the metal substrate 16 are fixed to each other via an adhesive layer of a high modulus of elasticity. Because of this, it is clear that warping is generated in the image-sensing element, and the function for reading manuscripts etc. during practical implementation deteriorates.

What is claimed is:

1. A solid-state image sensing device comprising:
    a long plate-shaped metal substrate;
    a long plate-shaped solid-state image sensing element fixed to the surface of the metal substrate with an adhesive layer; and
    bonding pads on the surface of the solid-state image sensing element, the bonding pads being electrically connected to a lead frame with bonding wires,
    wherein the adhesive layer is comprised of a first adhesive and a second adhesive with a higher modulus of elasticity than the first adhesive, and
    the solid-state image sensing element is fixed to the metal substrate at a region directly under the bonding pads at both end sections in a longitudinal direction of the solid-state image sensing element only with the second adhesive.

2. The solid-state image sensing device according to claim 1, wherein the modulus of elasticity of the second adhesive is from 4 GPa to 15 GPa.

3. The solid-state image sensing device according to claim 1, wherein the solid-state image sensing element is fixed to the metal substrate between the end sections only with the first adhesive.

4. The solid-state image sensing device according to claim 1, wherein main component of the bonding wire is aluminum.

5. The solid-state image sensing device according to claim 1, wherein the second adhesive comprises silicone resin.

6. The solid-state image sensing device according to claim 1, wherein the first adhesive comprises silicone resin.

7. The solid-state image sensing device according to claim 1, wherein the metal substrate is comprised of an iron or an alloy mainly composed of iron.

* * * * *